United States Patent

Waki

Patent Number: 6,080,604
Date of Patent: Jun. 27, 2000

[54] SEMICONDUCTOR DEVICE HAVING TAB-LEADS AND A FABRICATION METHOD THEREOF

[75] Inventor: Masaki Waki, Kawasaki, Japan

[73] Assignee: Fujitsu Limited, Kawasaki, Japan

[21] Appl. No.: 08/901,280

[22] Filed: Jul. 29, 1997

Related U.S. Application Data

[62] Division of application No. 08/724,051, Sep. 3, 1996, Pat. No. 5,701,028, which is a continuation of application No. 08/413,906, Mar. 30, 1995, abandoned.

[30] Foreign Application Priority Data

Jul. 18, 1994 [JP] Japan ................................. 6-165077

[51] Int. Cl.⁷ .......................... H01L 21/44; H01L 21/48; H01L 21/50
[52] U.S. Cl. ......................... 438/118; 438/106; 438/126
[58] Field of Search .................. 438/118, 106, 438/126

[56] References Cited

U.S. PATENT DOCUMENTS

| | | | |
|---|---|---|---|
| 5,010,038 | 4/1991 | Fox et al. | 438/106 |
| 5,252,853 | 10/1993 | Michii | 257/666 |
| 5,296,737 | 3/1994 | Nishimura et al. | 257/673 |
| 5,298,464 | 3/1994 | Schlesinger et al. | 438/118 |
| 5,304,842 | 4/1994 | Farnworth et al. | 257/668 |
| 5,365,409 | 11/1994 | Kwon et al. | 361/813 |
| 5,733,802 | 3/1998 | Inoue et al. | 438/126 |

FOREIGN PATENT DOCUMENTS

| | | |
|---|---|---|
| 173065 | 6/1990 | Japan . |
| 5-13500 | 1/1993 | Japan . |
| 5-13506 | 1/1993 | Japan . |

*Primary Examiner*—Kevin M. Picardat
*Assistant Examiner*—Deven Collins
*Attorney, Agent, or Firm*—Armstrong, Westerman, Hattori, McLeland & Naughton

[57] ABSTRACT

A semiconductor device having a semiconductor chip and a TAB lead adhering to a surface of the semiconductor chip by a TAB tape which electrically connects an internal terminal arranged in a center part of a surface of the semiconductor chip to an external terminal arranged around a periphery of the semiconductor chip. One embodiment according to the present invention is an LCO semiconductor device having the TAB lead connecting to a lead-frame assembled in an IC package. Another embodiment according to the present invention is a TAB tape of thermo-plasticity comprising a first surface having a first softening temperature and a second surface having a second softening temperature which is different from the first softening temperature.

4 Claims, 9 Drawing Sheets

SEMICONDUCTOR DEVICE HAVING TAB-LEADS AND A FABRICATION METHOD THEREOF

This is a Division of application Ser. No. 08/724,051 filed Sep. 3, 1996 U.S. Pat. No. 5,701,028; which is a Continuation application of Ser. No. 08/413,906 filed Mar. 30, 1995, which is now abandoned.

FIELD OF INVENTION

The present invention relates to a semiconductor device and a fabrication method thereof, more particularly to the semiconductor device having TAB leads and a fabrication method thereof.

DESCRIPTION OF THE PRIOR ART

Figure 8:
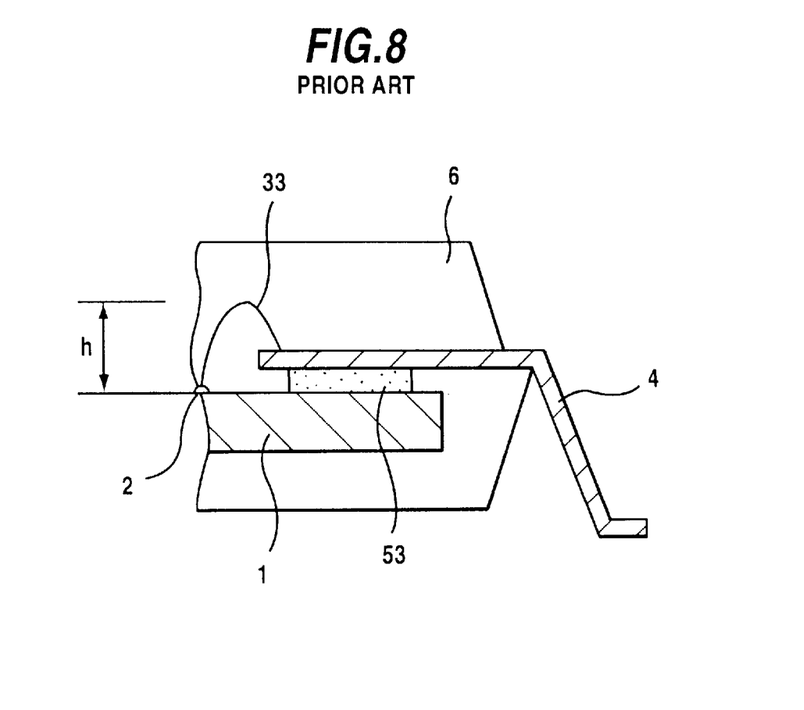
FIG. 8 is a cross-sectional view of a half part of a COB semiconductor device for prior art.

FIG. 8 is a cross-sectional view of a right-half side of a typical lead-on-chip (LOC) semiconductor device by prior art, in which an internal terminal 2 of interconnections is laid out in a center part of a semiconductor chip 1, and a lead-frame 4 is extended to the center part of the chip connected with the internal terminal 2 by a bonding wire 33. The lead-frame 4 is fixed to the semiconductor chip 1 by pressure-sensitive double coated adhesive tape 53. Since a lead-frame must be mechanically strong enough to hold the whole device encapsulated by mold 6 against an external board or a socket, it is usually made of hard metals such as iron or nickel, and then larger in width and thickness than interconnections. For this reason, a lead-frame can not compete with interconnections for miniaturization. Moreover, wire-bonding to the internal terminal of interconnections arranged in higher-packing density will be harder because of difficulty in manufacturing a jig having a microhead for guiding a bonding-wire 33. Another problem is that in this configuration, a height h of the bonding-wire 33 would be at least 300 μm which requires a thicker mold of IC package than conventional.

SUMMARY OF INVENTION

It is an object according to a first aspect of the present invention to provide a semiconductor device having internal terminals laid out in high packing density in a center part of a surface of a semiconductor chip which can be electrically connected to external terminals by a TAB lead which is fixed to the surface of the semiconductor chip by a TAB tape, therefore, the TAB lead can be easily compatible to the internal terminals in high packing density and also save the height due to adhering to the surface of the semiconductor chip.

It is an object according to a second aspect of the present invention to provide a TAB tape having a TAB lead thereon which can easily connect between terminals of integrated circuits on a semiconductor chip and terminals of lead-frame or external circuit boards without changing widely-used IC packages or fabrication equipments for automated assembly system.

DESCRIPTION OF THE PREFERRED EMBODIMENTS

Figure 1A:
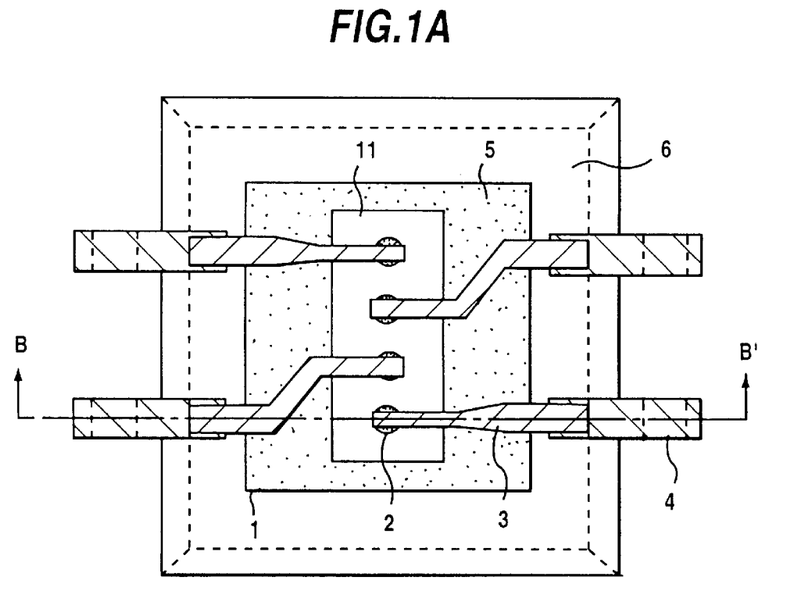
FIG. 1A is a plan view of an LCO semiconductor device according to the present invention.
Figure 1B:
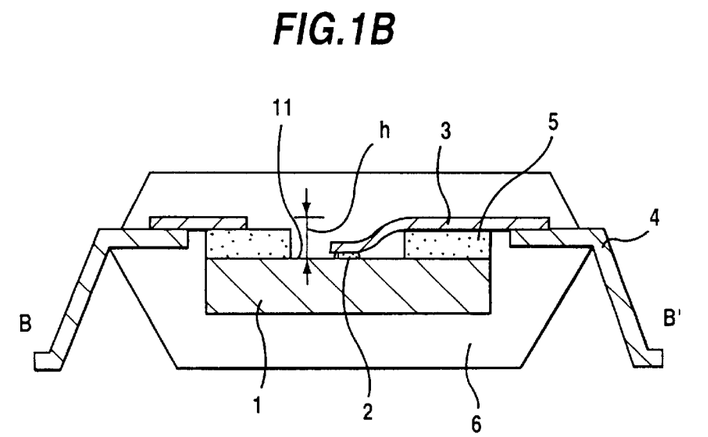
FIG. 1B is a cross-sectional view of an LCO semiconductor device according to the present invention.

FIGS. 1A and 1B show a plan view and a cross-sectional view of an LCO semiconductor device according to the present invention, respectively. It is a general tendency of the recent LSI technology that internal terminals 2 of LSI circuits are laid out in a center part on a surface of a semiconductor chip 1 which can save areas on the surface for interconnections. These internal terminals are formed by gold bumps or pads. One end of each TAB lead 3 is connected to the internal terminal by thermal compression, and another end which extends outward beyond a periphery of the semiconductor chip is connected to the external terminal 4 by thermal compression, which is a lead-frame mounted in mold 6 in this case. The lead-frame is fixed to the surface of a semiconductor chip by a TAB tape 5 which is a pressure sensitive double-coated adhesive insulating film. This TAB lead structure can hold down a height of the interconnections on the surface of a semiconductor chip to the order of 100 μm, by which a mold 6 can be thinner to such an extent.

Figure 2A:
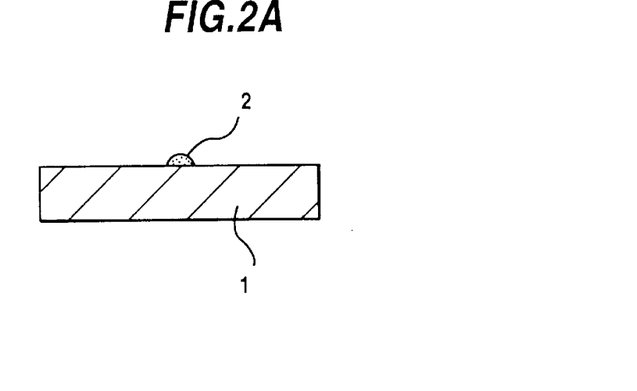
FIGS. 2A through 2F are cross-sectional views of an LCO semiconductor device shown in FIG. 1B for explaining fabrication steps according to the present invention.
Figure 2B:
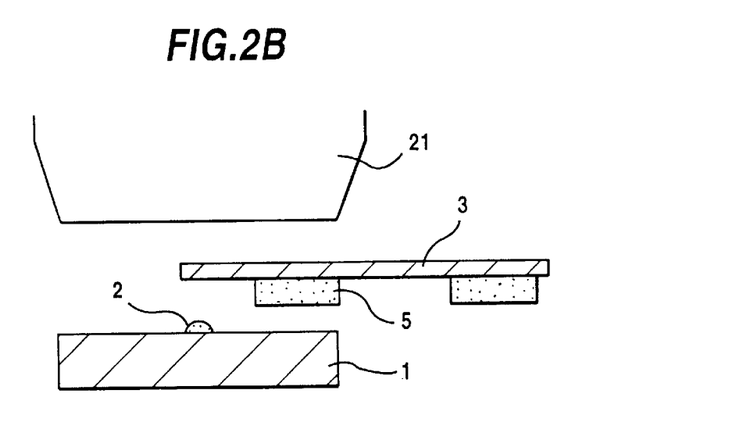
Figure 2C:
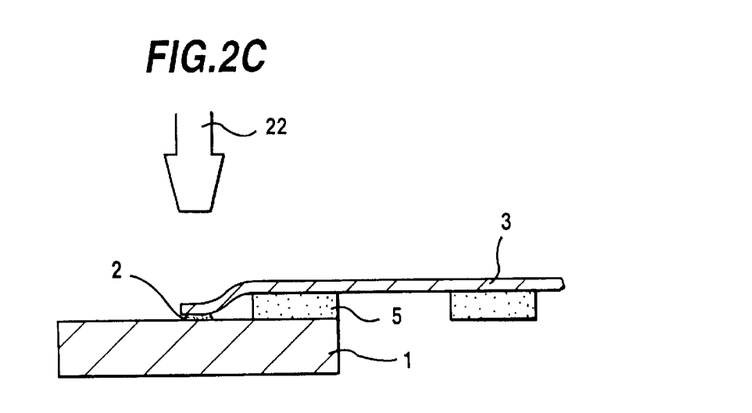
Figure 2D:
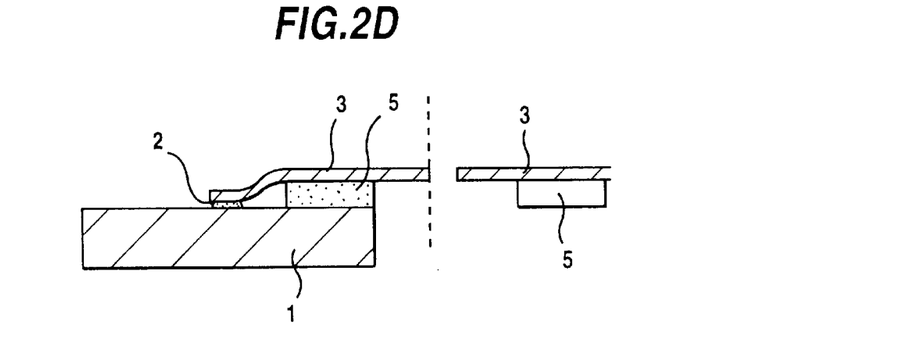
Figure 2E:
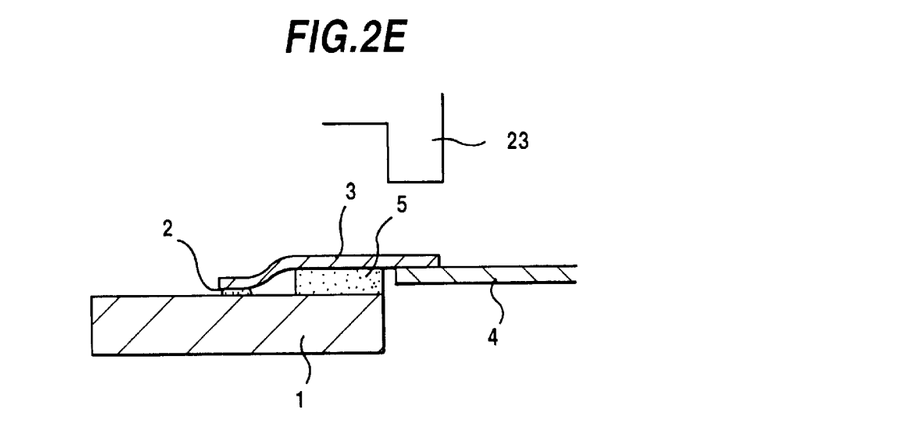
Figure 2F:
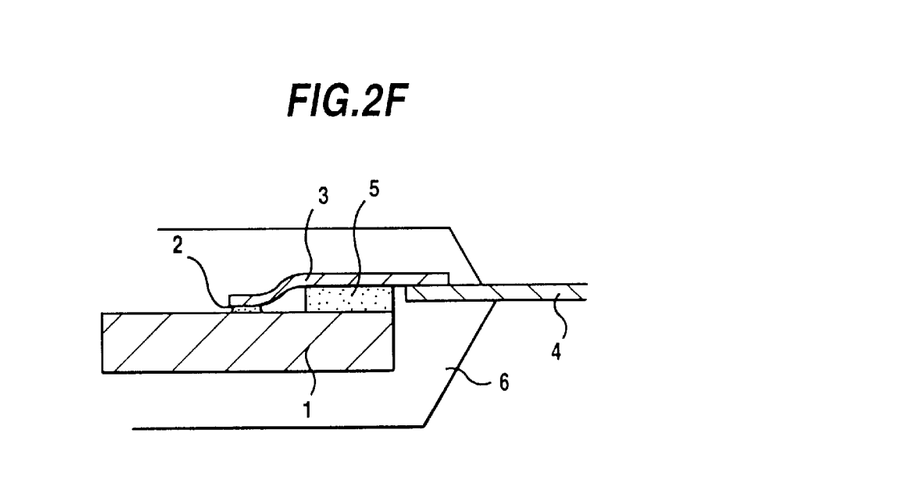

FIGS. 2A through 2F show fabrication steps of an LCO semiconductor device shown in FIG. 1B according to the present invention. FIG. 2A is a cross-sectional view of a semiconductor chip 1 and a gold bump 2 formed in a center part of a surface of the semiconductor chip which is an internal terminal of LSI circuits on the semiconductor chip 1. FIG. 2B shows that a TAB lead 3 supported by a TAB tape 5 having an adhesive layer on the surface facing against the surface of the semiconductor chip 1 is fixed to the surface of the semiconductor chip 1 by a first thermal compression head 21 so that one end of the TAB lead extends over the gold bump 2, and one of edges of the slit coincides with a periphery of the semiconductor chip 1. FIG. 2C shows that one end of the TAB lead extending over the gold bump 2 is pressed to the gold bump 2 to form an electrical connection by a second thermal compression head 22. FIG. 2D shows that the TAB lead is separated by cutting supporting parts of the TAB tape and an outer lead which is a part of the TAB lead across the slit 12 (denoted by a dotted line) for each semiconductor chip. FIG. 2E shows that the end of the outer lead is fixed to an end of a lead-frame 4 by a third thermal compression head 23. FIG. 2F shows that the whole semiconductor chip having the TAB lead connected to the lead-frame is encapsulated by plastic mold 6 so that the lead-frame is sticking out of the mold.

Figure 3A:
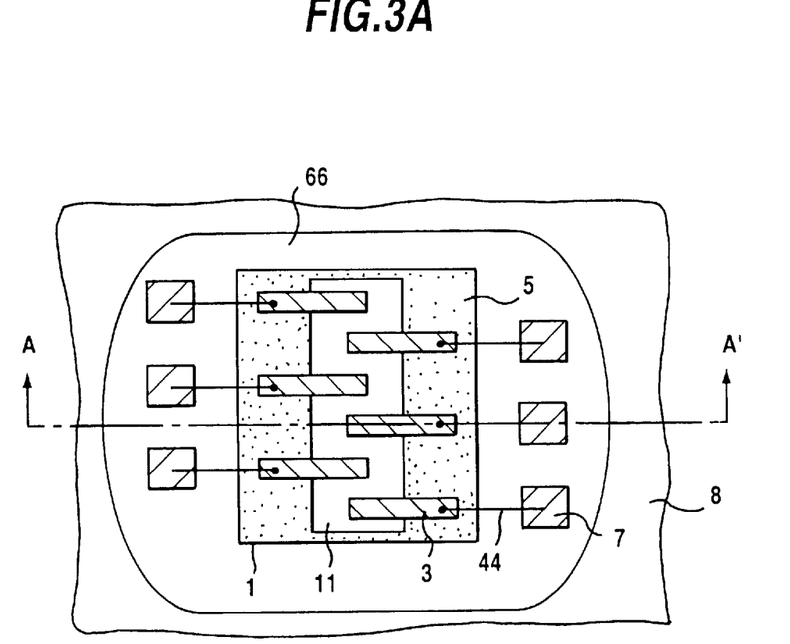
FIG. 3A is a plan view of a chip-on-board (COB) semiconductor device according to the present invention.
Figure 3B:
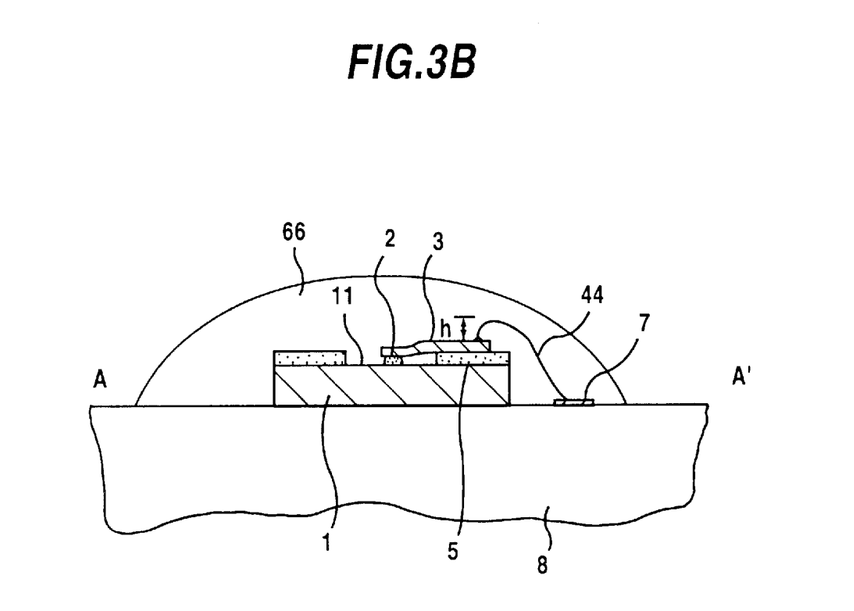
FIG. 3B is a cross-sectional view of a COB semiconductor device according to the present invention.

FIG. 3A shows that a plan view of a COB semiconductor device according to the present invention. A semiconductor chip 1 is fixed to a surface of a multi-layered interconnection board 8 by paste, a TAB lead 3 is fixed to a surface of the semiconductor chip by a TAB tape 5 which is a pressure sensitive double-coated adhesive insulating film. The fabrication steps are essentially the same as those explained before up to in FIG. 2D except that an another end of the TAB lead 3 opposite to the end connected to the gold bump in the device hole 11 is not extended beyond a periphery of the semiconductor chip. This end is electrically connected to an external terminal 7 formed on the surface of the multi-layered interconnection board 8 by a bonding wire 44. The whole semiconductor chip including bonding wires is sealed by a droplet of plastics which is sometimes called a "potting" 66. FIG. 3B shows that a cross-sectional view of a COB semiconductor device according to the present invention.

Figure 4:
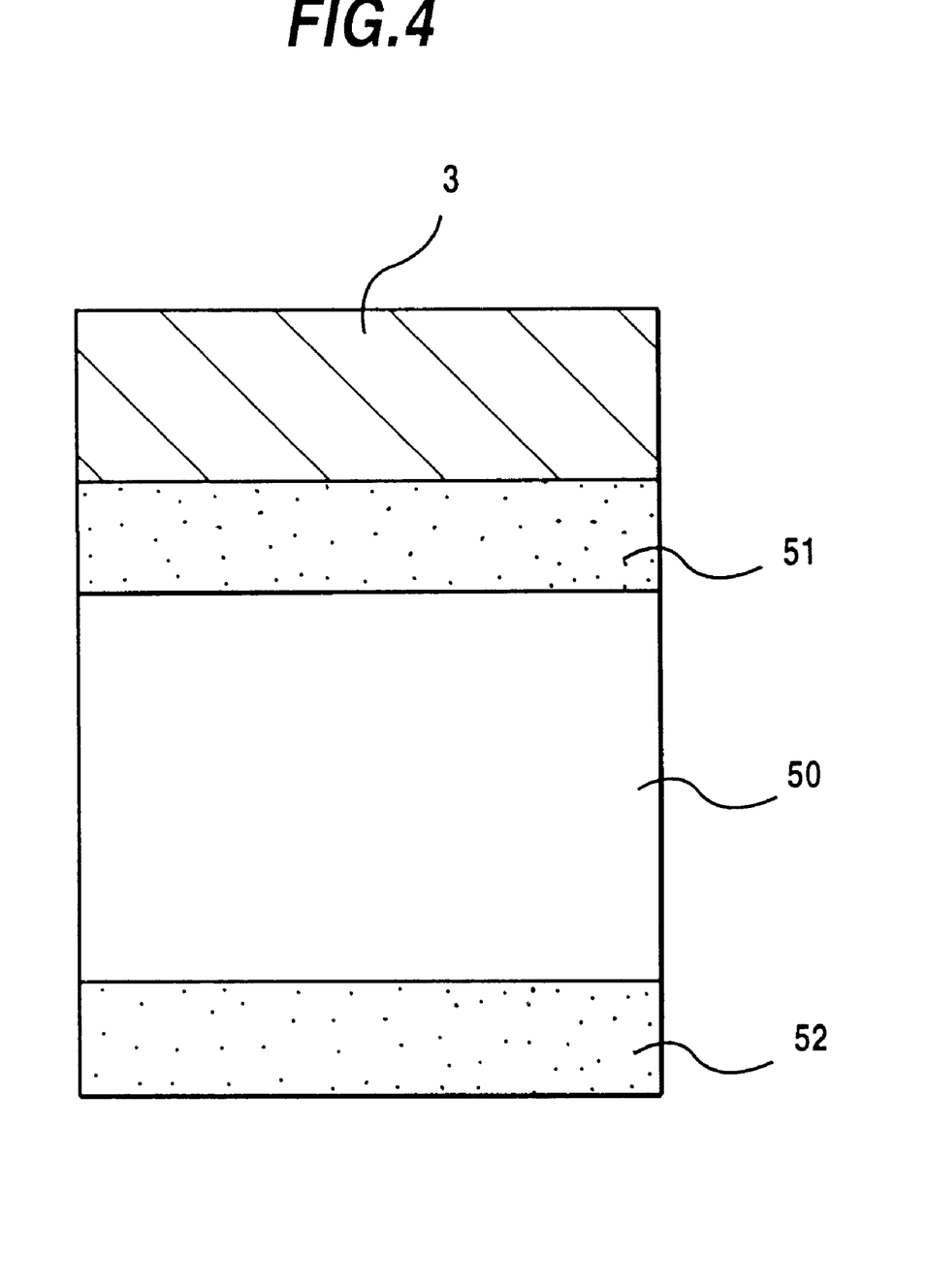
FIG. 4 is a cross-sectional view of a TAB tape according to the present invention.

FIG. 4 is a cross-sectional view of a TAB tape according to the present invention. The TAB tape consists of a base film of 75~125 µm thick polyimide 50, a first adhesive layer of 100 µm thick polyethylene 52, a second adhesive layer of 20 µm thick polyethylene 51, and a TAB lead of 35 µm thick pattered copper film 3. Both polyethylene films are adhesive resin of thermo-plasticity, a softening temperature (or transient temperature Tg) of the first adhesive layer 52 is higher than that of the second adhesive layer 51. This is because of preventing the first adhesive layer from get out of the fixed position by softening again at a second heating to coat the second adhesive layer. The first step fabricating the TAB tape is coating the first adhesive on the first surface of the base film by heating the first adhesive at a temperature higher than the softening temperature of the first adhesive, the second step is coating the second adhesive on the second surface at a temperature between the softening temperature of the first adhesive and that of the second adhesive, and subsequently the copper film is laminated to the second surface by thermal compression. The first adhesive could be polyimide and the second adhesive could be modified epoxy. When a TAB tape is fixed to a surface of a semiconductor chip, the semiconductor chip is heated at a temperature higher than the softening temperature of the first adhesive to soften the first adhesive, but the first compression head 21 which presses the TAB tape to the surface of the semiconductor chip needs to be cooled so as to maintain the second adhesive below the softening temperature of the second adhesive in order to preventing the patterned copper film from getting out of the fixed position by softening the second adhesive again. Furthermore, it needs to cool down the semiconductor chip quickly as soon as the TAB tape is fixed to the surface of the semiconductor chip by thermal compression. The first adhesive layer 52 can be omitted if the base film 50 has a softening temperature higher than that of the second adhesive layer 51, or if the semiconductor chip already has a protective layer whose softening temperature is higher than that of the second adhesive layer 51.

Figure 5A:
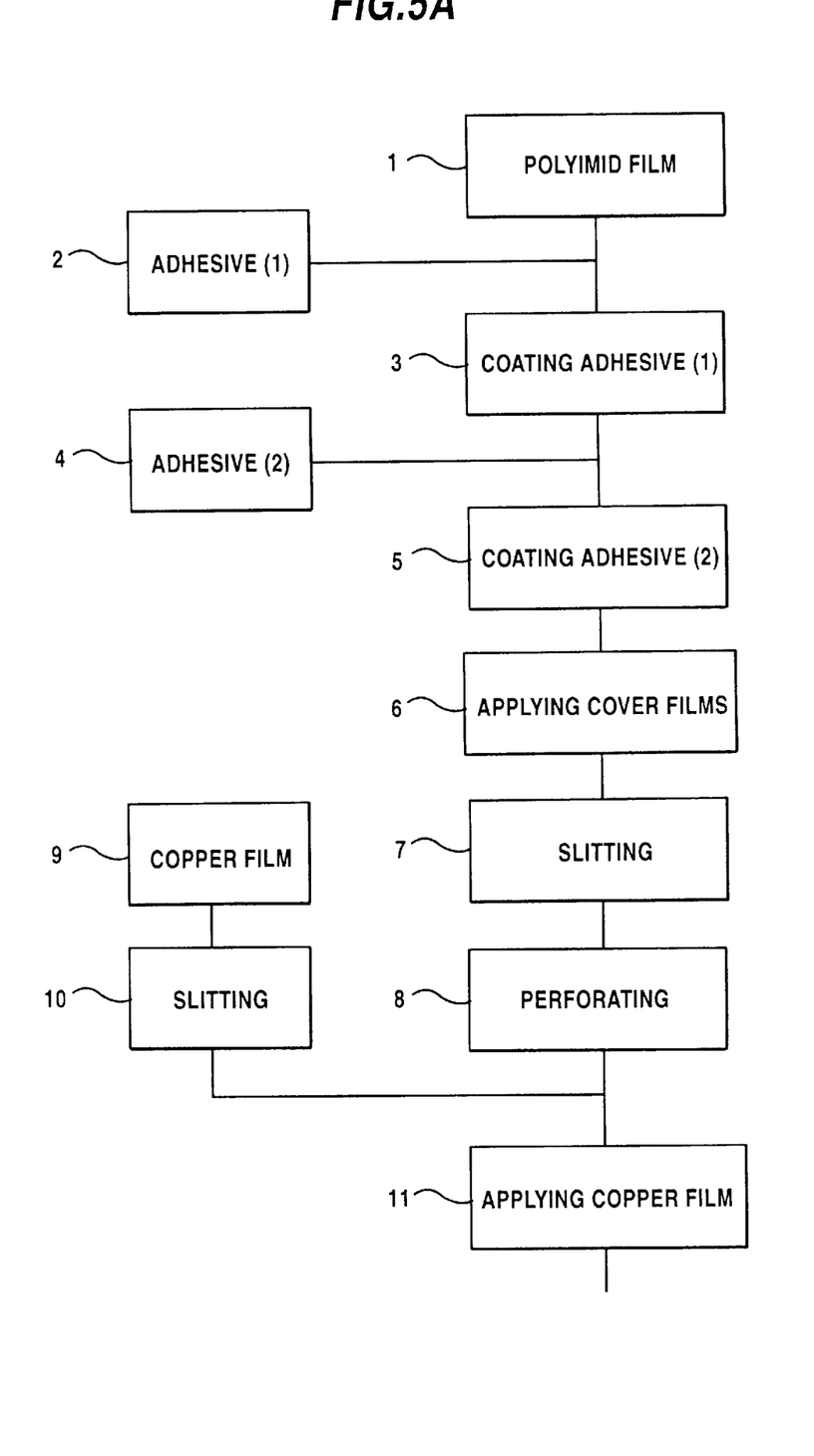
FIGS. 5A and 5B are flow charts for explaining fabrication steps of a TAB tape according to the present invention.
Figure 5B:
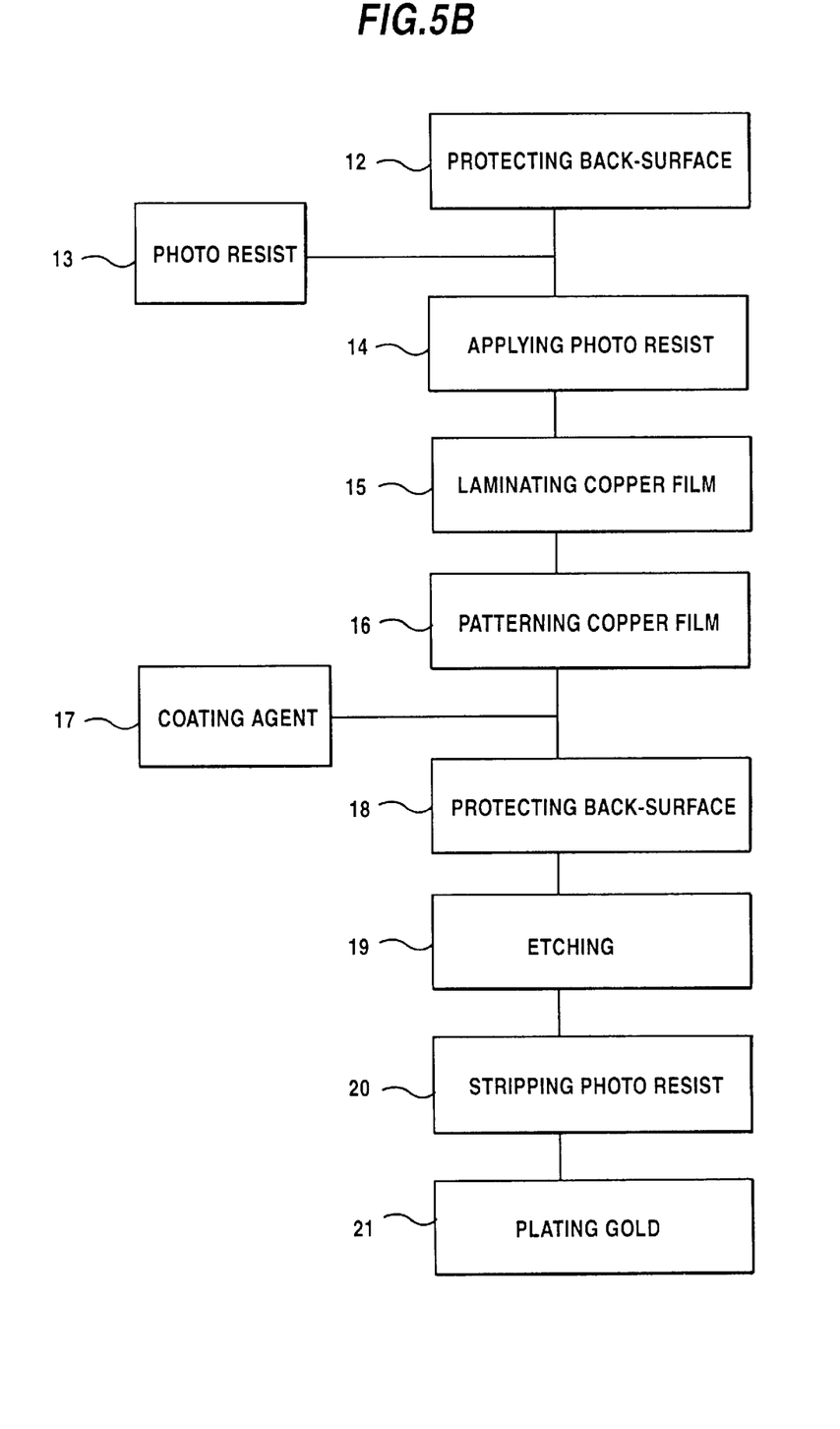

FIGS. 5A and 5B are flow charts for explaining fabrication steps of a TAB tape according to the present invention. The steps 1 through 5 carry out coating polyethylene adhesives on the both surfaces of a polyimide base film. The step 6 carries out laminating polyethylene films on the both surfaces as cover films to protect both adhesives against dusts or grazes. In the step 7, the whole laminated film is slit into a tape having a width of 35, 48, or 70 mm according to a width of the semiconductor chip mounted thereon. The step 8 carries out perforating a device hole 11 in a center part of the tape, four slits 12 around the device hole 11, and a pair of parallel chains of sprocket holes 13 arranged along the edges of the tape in the same denoted number as in FIG. 7A.

The steps 9 through 11 carry out slitting a copper film and laminating to the polyimide film by thermal compression. The step 12 carries out protecting the back surface of the copper film exposed in the device hole by photoresist against etchant. The steps 13 through 20 carry out patterning the copper film into a TAB lead by photolithography. The step 21 completes a TAB tape by plating gold on the surface of the TAB lead.

Figure 6:
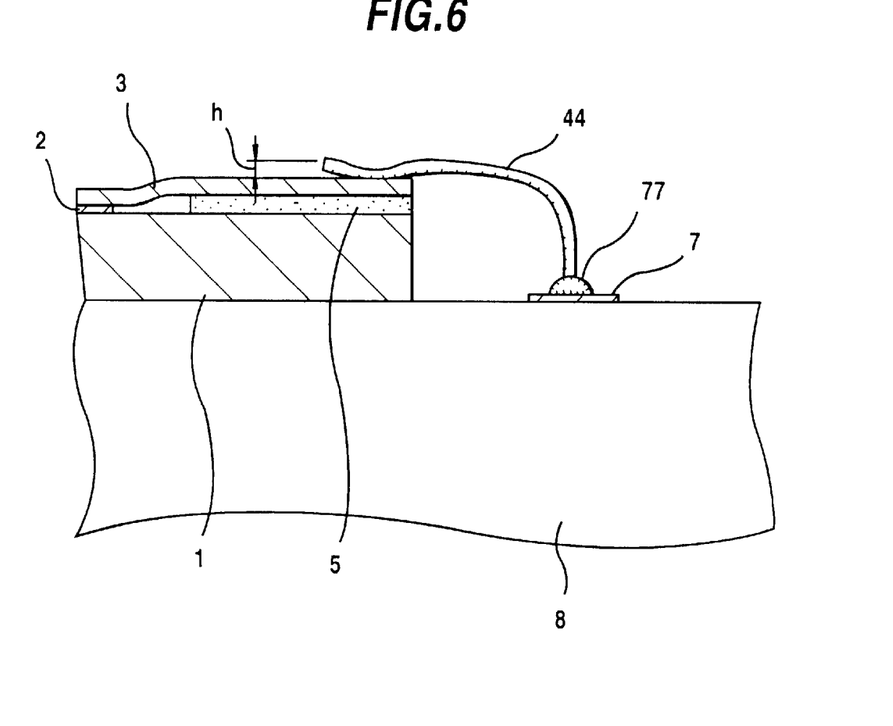
FIG. 6 is a cross-sectional view of a half part of a COB semiconductor device according to the present invention.

FIG. 6 is a cross-sectional view of a half part of a COB semiconductor device according to the present invention. It is for explaining the wire bonding according to the present invention in which a semiconductor chip 1 having an internal terminal 2 of a gold bump and a TAB lead 3 adhering to the surface of the semiconductor chip 1 by a TAB tape 5 is mounted on a multi-layered interconnection board 8 having an external terminal 7, and that a bonding wire 44 connects with the TAB lead 3 in parallel to the surface of the semiconductor chip by thermal compression bonding and with the external terminal 7 in perpendicular to the surface of the multi-layered interconnection board 8 by forming a ball 77 of bonding wire. In this embodiment, the height h of the wire bonding from the surface of the TAB lead can be as small as almost a diameter of the bonding wire, because each angle of the bonding wires against the terminals are opposite to each of those in the conventional semiconductor device, in which as shown in FIG. 8, a bonding wire 33 connects with the internal terminal 2 in perpendicular to the surface of the semiconductor chip by forming a ball and an end of the lead-frame 4 in parallel to the surface of the the lead-frame by thermal compression bonding which adheres to the surface of the semiconductor chip by a pressure-sensitive double coated tape 53.

Figure 7A:
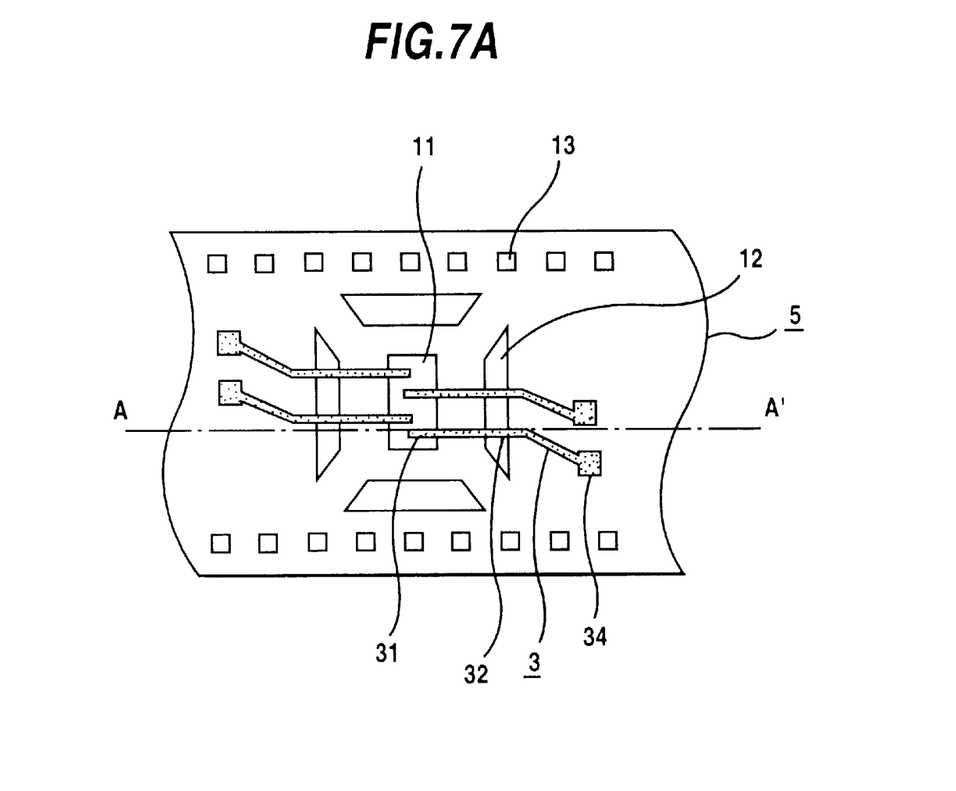
FIG. 7A is a plan view of a TAB tape in a part for a semiconductor chip according to the present invention.
Figure 7B:
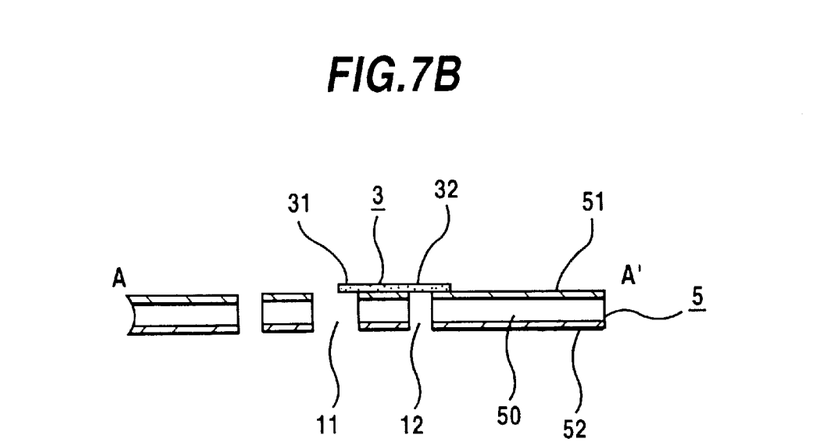
FIG. 7B is a cross-sectional view of a TAB tape in the part for a semiconductor chip according to the present invention.

FIGS. 7A and 7B are a plan view and a cross-sectional view of a TAB tape in the part for a semiconductor chip according to the present invention, respectively. The TAB tape 5 is a long flexible tape which is usually rolled by a spool. The base film 50 is made of a polyimide film having adhesives 51 and 52 on both surfaces. The device hole 11 is in a center part of the tape, slits 12 around the device hole, and sprocket halls 13 along both edges of the tape. Patterned TAB leads 3 are fixed to the tape 5 by the adhesive 51. The TAB tape consists of an inner lead extended over in the device hole 11, and an outer lead across the slit, beyond which the outer lead is ended by a test pad 34. A set of the holes and patterned leads is repeated on the TAB tape for each of the semiconductor chips. A geometry of the holes and a number of the leads depend upon the semiconductor chip. The TAB tape is usually fed from a spool to adhere to a semiconductor chip aligning each of the inner leads to each of the internal terminals on the surface of a semiconductor chip and each of peripheries of a semiconductor chip being in each of the slits.

I claim:

1. A method for fabricating semiconductor devices having a semiconductor chip having an internal terminal arranged in a center part of a surface thereof, an external terminal arranged around peripheries of the semiconductor chip, and a TAB lead consisting of an inner lead and an outer lead, the inner lead connecting to the internal terminal and the outer lead connecting to the external terminal, the TAB lead adhering to a TAB tape laid on the surface of the semiconductor chip, the TAB tape having a device hole in a center part thereof and a periphery parallel to a periphery of the semiconductor chip, the method comprising the steps of:

fixing the TAB tape to a surface of the semiconductor chip by thermo-compression bonding so that the inner lead extends over the internal terminal arranged in the center part of the surface of the semiconductor chip and exposed in the device hole, and the outer lead across a slit of the TAB tape extends outward beyond a periphery of the semiconductor chip;

connecting the inner lead to the internal terminal by thermo-compression bonding;

separating the TAB lead for the semiconductor chip by cutting the outer lead in the slit of the TAB tape and a part of the TAB tape supporting the TAB lead to be separated so that the outer lead extends outward beyond a periphery of the semiconductor chip; and connecting the outer lead to the external terminal by thermo-compression bonding.

2. The method for fabricating semiconductor devices according to the claim 1, wherein the TAB tape is made of an insulating film having a first adhesive layer on a first surface thereof which adheres to the surface of the semiconductor chip and a second adhesive layer on a second surface opposite to the first surface to which the TAB lead adheres, and both adhesive layers have thermo-plasticity and a softening temperature of the first adhesive layer is higher than a softening temperature of the second adhesive layer.

3. The method for fabricating semiconductor devices according to the claim 2, further comprising the step of:

fixing the TAB tape to the surface of the semiconductor chip by thermo-compression bonding so that the inner lead extends over the internal terminal exposed in the device hole and the outer lead extends across a slit of the TAB tape outward beyond a periphery of the semiconductor chip by keeping a temperature of the surface of the semiconductor chip higher than the softening temperature of the first adhesive layer and a temperature of a press head lower than the softening temperature of the second adhesive layer so that the TAB tape can adhere to the surface of the semiconductor chip but avoids the TAB lead to get out of a position on a surface of the TAB tape in which the TAB lead is already fixed by the second adhesive layer.

4. A method for fabricating a TAB tape having pressure-sensitive double coated adhesives which have thermo-plasticity, wherein a softening temperature of the first adhesive is higher than a softening temperature of the second adhesive, comprising the steps of:

coating a first adhesive to a first surface of a sheet of insulating film by heating the first adhesive at a temperature higher than a softening temperature thereof;

coating a second adhesive to a second surface opposite to the first surface at a temperature between the softening temperature of the first adhesive and the softening temperature of the second adhesive;

slitting the sheet of insulating film into a tape to fit to a semiconductor chip in width;

perforating a device hole, slits around the device hole for each of the semiconductor chip and a pair of parallel chains of sprocket holes on the tape;

laminating a sheet of copper on the second surface of the tape by thermo-compression at a temperature between the softening temperature of the first adhesive and the softening temperature of the second adhesive;

patterning the sheet of copper into a plurality of TAB leads by photolithography, each of which consists of an inner lead that extends over an internal terminal arranged in a center part of a surface of the semiconductor chip and exposed in the device hole, outer lead, and a test pad; and plating gold on each surface of the TAB leads patterned on the TAB tape.

* * * * *

UNITED STATES PATENT AND TRADEMARK OFFICE
CERTIFICATE OF CORRECTION

PATENT NO. : 6,080,604
DATED : June 27, 2000
INVENTOR(S) : Masaki Waki

Page 1 of 1

It is certified that error appears in the above-identified patent and that said Letters Patent is hereby corrected as shown below:

Column 4,
Line 40, change "halls" to --holes--;
Line 42, change "tape" to --lead--, and before "extended" insert --32--;
Line 43, after "lead", insert --32--.

Signed and Sealed this

Twenty-six Day of June, 2001

*Attest:*

NICHOLAS P. GODICI
*Attesting Officer*     *Acting Director of the United States Patent and Trademark Office*